United States Patent [19]

Künzig

[11] 4,298,636
[45] Nov. 3, 1981

[54] PROCESS FOR ACTIVATING PLASTIC SURFACES FOR METALLIZATION THEREOF BY TREATMENT WITH A COMPLEX FORMING SOLUTION

[75] Inventor: Herbert Künzig, Aschaffenburg, Fed. Rep. of Germany

[73] Assignee: Licentia Patent-Verwaltungs-G.m.b.H., Frankfurt am Main, Fed. Rep. of Germany

[21] Appl. No.: 137,826

[22] Filed: Apr. 7, 1980

Related U.S. Application Data

[63] Continuation-in-part of Ser. No. 84,138, Oct. 12, 1979.

[30] Foreign Application Priority Data

Oct. 12, 1978 [DE] Fed. Rep. of Germany ....... 2844425
Jul. 28, 1979 [DE] Fed. Rep. of Germany ....... 2930784

[51] Int. Cl.$^3$ ................................................. C23C 3/02
[52] U.S. Cl. .................................. 427/304; 106/1.11; 427/305; 427/306; 430/417
[58] Field of Search ............................. 427/304–306; 106/1.11; 430/417

[56] References Cited

U.S. PATENT DOCUMENTS 3,484,270 12/1969 Sanbestre et al. .
3,607,350 9/1971 Rathsack .
3,620,804 11/1971 Bauer et al. .
3,627,558 12/1971 Roger et al. .
3,915,809 10/1975 Wheatley .
3,962,496 6/1976 Leech .................................. 427/306
3,993,807 11/1976 Stabenow et al. .
4,148,945 4/1979 Bangs et al. .
4,153,746 5/1979 Kilthau .............................. 427/304

FOREIGN PATENT DOCUMENTS 48-28356 8/1973 Japan ................................. 427/304

OTHER PUBLICATIONS

Goldie, "Metallic Coating of Plastics", Electrochemical Publications Limited, 1968, printed in Great Britain, pp. 539–552.

*Primary Examiner*—John D. Smith
*Attorney, Agent, or Firm*—Spencer & Kaye

[57] ABSTRACT

Plastic surfaces are activated for the reception of adherent metal coatings by depositing noble metal nuclei thereon, the noble metal nuclei being deposited by a multistep process including the steps of mechanically roughening the surface, treating the roughened surface with a complex-former solution, thereafter treating the surface with a solution of a noble metal complex salt so as to exchange the noble metal complex for the complex deposited by the initial complex-former solution, and converting the noble metal complex to form metal nuclei.

33 Claims, No Drawings

PROCESS FOR ACTIVATING PLASTIC SURFACES FOR METALLIZATION THEREOF BY TREATMENT WITH A COMPLEX FORMING SOLUTION

CROSS REFERENCE TO RELATED APPLICATION

This application is a continuation-in-part application of my copending U.S. Application Ser. No. 084,138, filed Oct. 12, 1979.

BACKGROUND OF THE INVENTION

The present invention relates to a process for activating or sensitizing the surfaces of plastic materials by chemical nucleation with a noble metal so that a metallization can be performed thereafter.

When metallizing plastics, such as acrylonitrilebutadiene-styrene (hereinafter referred to as ABS) or modified Plexiglas materials, it is customary to acitvate the surface, after it has been roughened mechanically, by means of a strong oxidation agent, e.g. hot $SO_3$ vapor, in order to then be able to nucleate the surface with a noble metal. After being activated with noble metal nuclei, the plastic surfaces may then be metallized, e.g., with copper, nickel, silver, gold, the metals being chemically deposited on the noble metal nuclei. The above explained measures are called the SAN method.

While the so-called SAN method results in the formation of adherent metal coatings on plastic surfaces, the method is characterized by several disadvantages. For example, one disadvantage of this method is that the $SO_3$ vapor is not only very toxic, but it is also very corrosive. This requires considerable expenditures for equipment in order to keep environmental pollution within limits and to prevent any danger to the health of the personnel operating the plant.

SUMMARY OF THE INVENTION

Therefore, it is the object of the present invention to develop a nonoxidative method for activating plastic surfaces.

It is another object to activate plastic surfaces for subsequent metallization with noble metal nuclei by a process which employs nonpolluting materials which can be handled without excessive expenditures for equipment.

Yet another object is to provide a process for nucleating plastic surfaces with a nobel metal without the generation of toxic or otherwise dangerous vapors.

Still another object is to provide a process for activating plastic surfaces for subsequent metallization wherein the process employs materials which are readily available at favorable costs.

The above and other objects and advantages are achieved in accordance with the present invention by first mechanically roughening the surface of a plastic material to be metallized. The mechanically roughened surface is then dipped into or otherwise treated with a complex-former solution to deposit a complex on the roughened surface, whereafter the surface is dipped into or otherwise treated with a solution of a noble metal complex salt so that an exchange of the initially deposited complex for a noble metal complex takes place at the plastic surface. The noble metal complex is then converted to noble metal nuclei.

It is to be understood that both the foregoing general description and the following detailed description are exemplary, but are not restrictive of the invention.

DETAILED DESCRIPTION OF THE INVENTION

The present invention is applicable to the activation of a wide variety of plastic substrates, and is particularly applicable to substrates made from ABS plastics and acrylic thermoplastics such as those made from methyl methacrylate monomers, for example, Plexiglas plastics. A modified Plexiglas on the basis of acryl resin can be used. Other suitable materials are thermoplastics and thermosetting plastics such as ABS plastics (ABS=acrylonitrile butadiene styrene).

In a preferred embodiment of the invention, the surface of the plastic substrate is mechanically roughened by means of a blast of glass shot or balls in which the glass balls have a diameter of about 120 to 250u. The glass balls can be propelled against the plastic substrate through a conventional nozzle, such as a Laval nozzle, by means of compressed air. This produces a microroughness which constitutes the basis for the wettability of the plastic and the adhesion of the subsequent metallization. The macroscopically observed surface has the structure of a hammered surface. When glass balls are used, no noticeable amount of material is removed, since the surface is essentially merely deformed.

In one preferred embodiment of the present invention, a plastic with glass fiber reinforcement is used as the substrate, and in this embodiment, the plastic preferably is treated, after the roughening by means of the glass balls, with a commercially available conditioner so as to obtain wettability of the glass fibers. If wettability of the glass fibers has been attained, there results a noticeable increase in adhesion of the chemical metallization. A suitable conditioner is the Conditioner 1160 sold by the U.S. firm Shipley. It operates by hydrophilizing plastic surfaces.

The complex-former solution used to treat the roughened plastic preferably comprises ethylene diamine tetraacetic acid (EDTA) or its alkali salts. Such complex-formers are preferably soluble in an alkali solution, and preferably are applied to the plastic substrate from the alkali solution. The alkali solution converts the mechanically roughened surface of the plastic to a hydrophilic surface state which facilitates the deposition of the complex-former.

Advantageously, the alkali solution is prepared by first dissolving an alkali hydroxide in water, which causes the solution to heat up, and then adding the complex-former. The complex-former solution has the advantage that the vessels employed during the process are not noticeably attacked by the alkali liquor. For that reason, inexpensive plastic containers can be used which can withstand the solution without difficulty. A suitable complex former is the sodium salt of ethylenediamine tetraacetic acid.

The concentration of the complex former solution is about NaOH 200 g/l+EDTA 10 g/l in aqueous solution. The pH is greater than 13.

The roughened plastic surface is treated with the complex-forming solution, preferably by dipping the plastic into the solution, for about 2 to 10 minutes, for example, 5 minutes. The complex-former solution generally is maintained at about 70 to 80° C., and preferably at about 70° C., during the treatment of the plastic. During this treatment, there is no noticeable loss of material at the plastic surface. The plastic surface is then rinsed in cold water.

The rinsed plastic is then treated with a noble metal complex salt solution, as by dipping or immersing the plastic into the noble metal complex salt solution. Preferably, the noble metal complex salt solution employed is a hydrochloric acid solution of palladium chloride and an alkali chloride, this solution subsequently being diluted with water and adjusted to pH of preferably about 5.5 by the addition of an alkali hydroxide solution.

Only sodium chloride can be used in the preferred noble metal complex salt solution. The concentrations in the preferred noble metal complex salt solution are the following:
HCl 10 ml/l
PdCl 1 g/l
NaCl 1 g/l
A 1 N-NaOH aqueous solution is added until the pH is 5.5.

By the adjustment of the pH to 5.5, there occurs, by reason of disproportionation in the solution, the formation of noble metal complexes. After dipping the plastic surfaces, which have been pretreated according to the method explained above, into this noble metal salt complex solution, the EDTA complex is exchanged for the noble metal complex. The term "EDTA complexes" is meant to include the above-mentioned ethylene diamine tetra acetic acid complexes and/or their salts. The surface affinity of the various complexes is responsible for the exchange of complexes on the treated plastic surfaces.

The liquid layer adhering to the plastic surface must be rinsed away. This is advantageously accomplished with an alkali solution which prevents leaching of the noble metal complexes out of the cavities produced by the glass ball blasting since the noble metal complexes are converted to noble metal hydroxides which form voluminous flakes. In this manner, the noble metal hydroxide is retained in the cavities. The alkali solution can be a 1N-NaOH aqueous solution.

Preferably, the conversion of the noble metal complexes or the noble metal hydroxide to the noble metal nuclei is effected by means of a chemical or photochemical reaction.

The chemical conversion of the noble metal hydroxide advantageously is effected in an alkali formaldehyde solution or in a slightly acid $SnCl_2$ solution. If the conversion is chemical, noble metal nuclei result which are embedded in the entire surface. Thus, if the conversion is chemical, a telephone housing or costume jewelry can be metallized.

The chemical conversion of the noble metal hydroxide can be effected in a formaldehyde solution of 600 ml/l with a starting concentration of 25%, or a tin chloride solution of 1 g/l. The reduction time is 1 to 10 minutes at room temperature. These solutions are caused to act by immersing the plastic in the solution.

If the conversion is photochemical, a suspension of a strongly n-doped semiconductor material is advisably applied to the surface by dipping. An aqueous suspension of n-doped germanium with a grain size of about $1\mu$ can be used for this purpose. The fine semiconductor crystallites become electron donors during the subsequent exposure or illumination process. The exposure is effected via a film mask and in this case the selective maximum of sensitivity lies at a wavelength of $0.9\mu$. The released electrons reduce the noble metal hydroxide to metal nuclei. This method permits selective nucleation. The suspension is advantageously rinsed off in an ammonium acetate solution and the unexposed, unconverted noble metal hydroxide is converted into a noble metal chloride and is rinsed away, e.g., in running water. The ammonium acetate solution comprises 1 g/l ammonium acetate and acts on the plastic at room temperature for a period between 1 and 5 minutes. The conversion of the unexposed, unconverted noble metal hydroxide into noble metal chloride takes place by way of hot hydrochloric acid decomposition. This produces noble metal nucleation only at the exposed surface areas. Then those parts that have the nuclei are metallized chemically.

Noble metals that can be employed for the nuclei include gold, iridium, osmium, palladium, platinum, rhodium, ruthenium or silver. Preferably, palladium is employed since it has a strong catalytic effect which increases the deposition rate during the subsequent chemical metallization. For reductively operating chemical metallization baths, it is of advantage to employ a catalyst such as palladium. For autocatalytically operating metallization baths, all noble metals can be used for the nuclei. Advisably, noble metal salt solutions are employed which have been prepared with a concentration of about 1 gram per liter of water.

Metals to be deposited on the activated plastic surfaces are preferably copper, nickel, gold and silver.

In order to attain a metal coating of sufficient thickness (1 to $3\mu$), the chemical metal deposition should employ autocatalytic baths or a reductively operating bath that is combined with an electrochemically operated metallization.

Compared to vacuum deposition of metals onto plastic surfaces, the process of the present invention has the advantage that it can be performed with much less apparatus. The process of the present invention employs nonpolluting materials exclusively, which can be handled without excessive expenditures for equipment. Moreover, the materials employed are available at favorable costs so that the activation can be performed in a particularly economical manner. Additionally, no aggressively dangerous vapors are developed during the performance of the process.

In the present invention ABS plastics can be metallized. It is also possible to metallize thermosetting plastics and thermoplastics. The objects produced by the metallization are, for example, circuit boards, telephone housings, etc.

In the practice of the present invention, the noble metal complex salt solution can be prepared in advance and stored for a period of time before it is used to treat the plastic surface. In the course of time, disproportionation causes noble metal complexes, for example, tetrachloro complexes and hexachloro complexes, to be formed in the solution of the noble metal complex salt. The formation of the noble metal complexes is favored at higher temperatures. The various complexes that are formed as a result of disproportionation are formed in the solution at different times and possess different properties with respect to their ability to be reduced or converted to metal nuclei. Thus, for example, when employing a palladium complex salt solution, tetrachloro complexes which are particularly suitable for reduction or conversion to metal nuclei are formed first and hexachloro complexes are formed later. In general, the initially formed complexes are particularly suitable for reduction or conversion to metal nuclei, but as time passes, the initially formed complexes themselves disproportionate leading to the formation of a plurality of noble metal complex intermediate stages, which in turn disproportionate and form relatively stable complexes, such as, for example, the hexachloro complexes, which are very difficult to reduce or convert to metal nuclei.

In the case of palladium, the desirable palladium tetrachloro complex, $PdCl_4^=$ which is especially suited to subsequent chemical or photochemical reduction to metal nuclei is stable only for 1 to 2 weeks whereupon it converts to a hexachloro complex. As a result, a large amount of palladium complex salt solutions becomes unusable after about two weeks. The palladium complex salt solution containing the palladium hexachloro complex can be reconverted back to a solution containing the starting palladium tetrachloro complex by, for example, producing a strongly alkali solution in which the palladium forms hydroxide flakes and a sediment. The palladium hydroxide thereafter is converted back to palladium chloride by heating in concentrated hydrochloric acid. Such a reconversion procedure, however, is time consuming, complicated and expensive.

In a preferred embodiment of the invention, the noble metal complex salt solution is prepared in such a way that the noble metal complexes formed as a result of disproportionation, and which are particularly suitable for reduction, are stabilized for longer periods of time, even at room temperature. This stabilization is achieved by adding acetone to the solution of the noble metal complex salt, which preferably is a palladium complex salt. The addition of acetone results in a stabilization of the noble metal complexes which are particularly suitable for reduction, which stabilization lasts for months, thereby avoiding time consuming, complicated and expensive reconversion procedures during the stabilization period, which is at least for a period of two months for palladium complex salt solutions. The acetone preferably is added immediately upon the formation of the complexes which are particularly suitable for reduction and at least before these complexes begin to substantially disproportionate from the ratio to the known complexes. Any unreducible noble metal complexes which still form after a short time and are unsuitable for reduction need not be reconverted to the starting material.

In one embodiment of this mode of the present invention, the proportion of acetone in the solution of the noble metal complex salt is up to fifty percent by volume. Preferably, the proportion of acetone in the solution of the noble metal complex salt is one or approximately one percent by volume.

In a preferred embodiment of the present invention, the noble metal complex salt solution comprises a solution of palladium chloride and alkali chloride in hydrochloric acid, diluted with water and set to a pH of 5.5 by the addition of an alkali hydroxide solution, and containing acetone which is added after disproportionation of the palladium chloride to a palladium tetrachloro complex. With the addition of acetone, the palladium tetrachloro complex is stabilized for a long period of time so that no noticeable proportion of palladium hexachloro complexes can be formed. It has been found that, without this addition of acetone, palladium tetrachloro complexes are stable at room temperature only for 1 to 2 weeks. By adding acetone, the palladium tetrachloro complexes remain stable for months.

Exemplary of this preferred embodiment of the present invention, a solution of palladium chloride and alkali chloride is dissolved in hydrochloric acid and subsequently diluted with water. Then a pH of about 5.5 is set by the addition of alkali hydroxide solution. After the pH has been set, disproportionation causes noble metal complexes to form. The hydrochloric acid solution of the palladium chloride before the addition of the alkali hydroxide has a light, reddish brown coloration. The addition of the alkali hydroxide solution produces flakes. The reddish brown solution and these flakes react by disproportionation to form a dark-brown, clear solution which contains a palladium tetrachloro complex ($PdCl_4^=$), which complex is the first complex that is formed in the solution.

The creation of the palladium tetrachloride complex can thus be recognized by the appearance of the dark brown coloration in the clear solution. This dark brown solution develops at room temperature within about 3 to 4 hours. When the solution is heated to about 70° C. the palladium tetrachloro complexes, which can be recognized by the dark brown coloration of the solution, appear in 30 to 40 minutes instead of 3 to 4 hours. The palladium tetrachloro complexes are particularly well suited for subsequent chemical or photochemical reduction, but are stable only for 1 to 2 weeks and then change by further disproportionation, to palladium hexachloro complexes which can be reduced only with difficulty.

For the purpose of stabilization, acetone is added to the dark brown, clear solution of the palladium tetrachloride complex, the proportion of acetone in the solution preferably being one percent by volume. The acetone can be added at any time after substantial disproportionation to the tetrachloro complexes occur, and preferably is added immediately after the formation of the tetrachloro complexes. In this way the palladium tetrachloro complexes are stabilized for a longer period of time. It has been found that this period of time is more than 2 months. As a result of the stabilization technique according to the present invention, it is not necessary to replenish or reconvert the complex salt solutions after a relatively short period of time. The only thing necessary is to replenish the part of the solution which is lost by the fact that solution adheres to the plastic surfaces during treatment of the plastic surfaces, but this part is very small.

Although the present invention has been described in conjunction with preferred embodiments, it is to be understood that modifications and variations may be resorted to without departing from the spirit and scope of the invention, as those skilled in the art readily will understand. Such modifications and variations are considered to be within the purview and scope of the present invention as defined by the appended claims.

What is claimed is:

1. A process for activating a plastic surface with noble metal nuclei for subsequent metallization, which comprises:
   (a) roughening the plastic surface to be metallized, by mechanical, nonoxidative means;
   (b) treating the mechanically, nonoxidatively roughened plastic surface with a complex-former solution to deposit a complex on the plastic surface;
   (c) treating the resulting plastic surface with a solution of a noble metal complex salt so that the complex deposited by the complex-former solution is exchanged for a noble metal complex on the plastic surface; and
   (d) converting the noble metal complex to metal nuclei.

2. The process as defined in claim 1 wherein said noble metal complex is converted to noble metal nuclei by first converting said noble metal complex to a noble metal hydroxide and then treating said noble metal hydroxide with an alkali formaldehyde solution or an acid stannous chloride solution.

3. The process as defined in claims 1 or 2 wherein the roughening of the plastic surface is effected by means of a blast of glass balls wherein the glass balls have a diameter of about 120 to 250μ.

4. The process as defined in claim 3 wherein said noble metal complex is converted to said noble metal nuclei by means of chemical or photochemical reduction.

5. The process as defined in claim 3 wherein a glass fiber reinforced plastic is employed and wherein before the roughened plastic surface is treated with the complex-former solution, the plastic is treated with a conditioner so as to attain wettability of the glass fibers.

6. The process as defined in claim 3 wherein said complex-former solution comprises a solution of ethylene diamine tetraacetic acid or an alkali metal salt thereof.

7. The process as defined in claim 1 wherein a glass fiber reinforced plastic is employed and wherein before the roughened plastic surface is treated with the complex-former solution of step (b), the plastic is treated with a conditioner so as to attain wettability of the glass fibers.

8. The process as defined in claim 1 or 2 or 7 wherein said complex-former solution of step (b) comprises a solution of ethylene diamine tetraacetic acid or an alkali metal salt thereof.

9. The process as defined in claim 8 wherein the noble metal complex salt solution is a solution of palladium chloride and an alkali chloride in hydrochloric acid, this solution then being diluted with water and thereafter adjusted to a pH of about 5.5 by the addition of an alkali hydroxide solution.

10. A process according to claim 9, wherein the solution of the noble metal complex salt contains acetone which stabilizes the noble metal complex salt.

11. A process according to claim 10 wherein the adjusting of the pH results in the palladium chloride disproportionating to a palladium tetrachloro complex, and the acetone is added to the noble metal complex salt solution containing the palladium tetrachloro complex after the pH has been adjusted.

12. The process as defined in claim 9, wherein the noble metal complex salt solution when diluted with water, contains about 1 gram per liter of solution of palladium chloride, about 1 gram per liter of solution of sodium chloride as the alkali chloride, and about 10 ml per liter of solution of hydrochloric acid.

13. The process according to claim 9, wherein said alkali hydroxide solution is sodium hydroxide solution.

14. The process as defined in claim 8 wherein said noble metal complex is converted to said noble metal nuclei by means of chemical or photochemical reduction.

15. The process as defined in claim 8, wherein said complex former solution has a pH greater than 13 and comprises a solution in water of about 200 grams per liter of solution of NaOH and about 10 grams per liter of solution of ethylene diamine tetraacetic acid.

16. The process as defined in claim 1 or 2 or 7 wherein the noble metal complex salt solution is a solution of palladium chloride and an alkali chloride in hydrochloric acid, this solution then being diluted with water and thereafter adjusted to a pH of about 5.5 by the addition of an alkali hydroxide solution.

17. The process according to claim 16, wherein said alkali hydroxide solution is sodium hydroxide solution.

18. The process as defined in claim 16 wherein said noble metal complex is converted to said noble metal nuclei by means of chemical or photochemical reduction.

19. The process as defined in claim 16, wherein the noble metal complex salt solution when diluted with water, contains about 1 gram per liter of solution of palladium chloride, about 1 gram per liter of solution of sodium chloride as the alkali chloride, and about 10 ml per liter of solution of hydrochloric acid.

20. The process according to claim 19, wherein the solution of the noble metal complex salt contains acetone which stabilizes the noble metal complex.

21. A process according to claim 16, wherein the solution of the noble metal complex salt contains acetone which stabilizes the noble metal complex salt.

22. A process according to claim 21 wherein the adjusting of the pH results in the palladium chloride disproportionating to a palladium tetrachloro complex, and the acetone is added to the noble metal complex salt solution containing the palladium tetrachloro complex after the pH has been adjusted.

23. A process according to claim 21 wherein said solution contains up to 50% by volume acetone.

24. A process according to claim 21, wherein said solution contains about 1% by volume acetone.

25. A process according to claim 24, wherein said solution contains up to 50% by volume acetone.

26. A process according to claim 24, wherein said solution contains about 1% by volume acetone.

27. The process as defined in claim 1 or 2 or 7 wherein said noble metal complex is converted to said noble metal nuclei by means of chemical or photochemical reduction.

28. The process as defined in claim 1 wherein said noble metal complex is converted to metal nuclei by first converting said noble metal complex to a noble metal hydroxide and then converting said noble metal hydroxide to said noble metal.

29. The process as defined in claim 1 wherein treating steps (b) and (c) are each performed by dipping.

30. A process according to claim 1, 2, 7, 28, or 29, wherein the solution of the noble metal complex salt contains acetone which stabilizes the noble metal complex salt.

31. A process according to claim 30, wherein said solution contains up to 50% by volume acetone.

32. A process according to claim 30, wherein said solution contains about 1% by volume acetone.

33. Process according to claim 30, wherein said solution is an aqueous solution.

* * * * *